United States Patent
Swoboda et al.

(10) Patent No.: US 12,151,314 B2
(45) Date of Patent: Nov. 26, 2024

(54) DEVICE AND METHOD FOR APPLYING PRESSURE TO STRESS-PRODUCING LAYERS FOR IMPROVED GUIDANCE OF A SEPARATION CRACK

(71) Applicant: Siltectra GmbH, Dresden (DE)

(72) Inventors: Marko Swoboda, Dresden (DE); Ralf Rieske, Dresden (DE); Christian Beyer, Freiberg (DE); Jan Richter, Dresden (DE)

(73) Assignee: Siltectra GmbH, Dresden (DE)

( * ) Notice: Subject to any disclaimer, the term of this patent is extended or adjusted under 35 U.S.C. 154(b) by 1240 days.

(21) Appl. No.: 16/638,044

(22) PCT Filed: Aug. 10, 2018

(86) PCT No.: PCT/EP2018/071814
§ 371 (c)(1),
(2) Date: Feb. 10, 2020

(87) PCT Pub. No.: WO2019/030400
PCT Pub. Date: Feb. 14, 2019

(65) Prior Publication Data
US 2020/0215648 A1   Jul. 9, 2020

(30) Foreign Application Priority Data
Aug. 11, 2017   (DE) .......................... 102017007585.9

(51) Int. Cl.
| | | |
|---|---|---|
| *B23K 26/53* | (2014.01) | |
| *B23K 26/14* | (2014.01) | |
| *B23K 26/146* | (2014.01) | |
| *B23K 26/70* | (2014.01) | |
| *B28D 5/00* | (2006.01) | |
| *H01L 29/16* | (2006.01) | |

(52) U.S. Cl.
CPC .............. *B23K 26/53* (2015.10); *B23K 26/14* (2013.01); *B23K 26/146* (2015.10); *B23K 26/70* (2015.10);
(Continued)

(58) Field of Classification Search
CPC ........ B23K 26/50; B23K 26/53; B23K 26/70; B28D 5/0005; B28D 5/0011; H01L 29/1608
(Continued)

(56) References Cited

U.S. PATENT DOCUMENTS

2006/0131703 A1* 6/2006 Majumdar ............. H05K 3/046
257/665
2009/0050610 A1  2/2009 Takamatsu et al.
(Continued)

FOREIGN PATENT DOCUMENTS

| CN | 101341100 A | 1/2009 |
|---|---|---|
| CN | 105514036 A | 4/2016 |

(Continued)

OTHER PUBLICATIONS

Swoboda, Marko, et al., "Laser Assisted SiC Wafering Using COLD SPLIT", Materials Science Forum, vol. 897, 2016 European Conference on Silicon Carbide & Related Materials (ECSCRM), Sep. 25-29, 2016, pp. 403-406.

*Primary Examiner* — Nathaniel E Wiehe
*Assistant Examiner* — Alba T Rosario-Aponte
(74) *Attorney, Agent, or Firm* — Murphy, Bilak & Homiller, PLLC

(57) ABSTRACT

The present invention relates to a method, according to claim 1, for separating at least one solid body layer (1), particularly a solid body disk, from a donor substrate (2). The method according to the invention comprises preferably at least the following steps: providing a donor substrate (2); producing or arranging a stress-producing layer (4) on a particularly flat surface (5) of the donor substrate (2) which axially defines the donor substrate (2); pressing at least one pressure application element (6) of a pressure application device (8) onto at least one pre-determined portion of the stress-producing layer (4), in order to press the stress-
(Continued)

Figure 2:
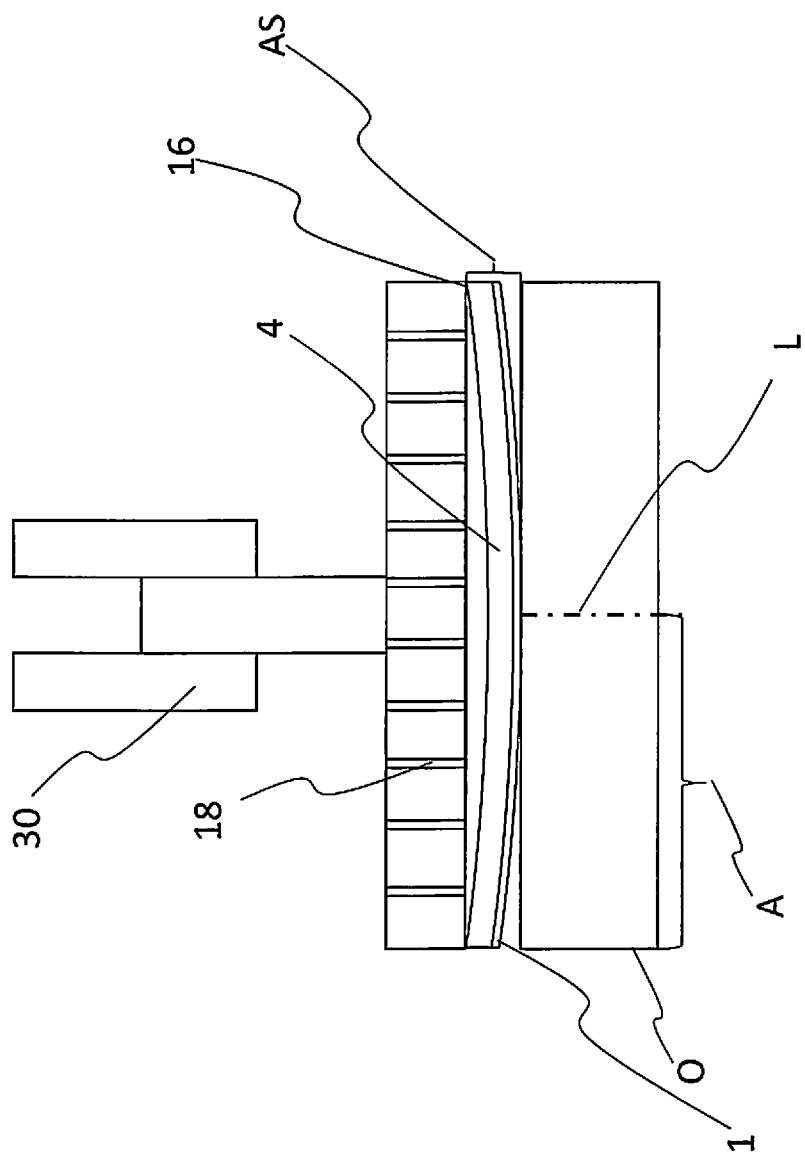

producing layer (4) onto the surface (5); separating the solid body layer (1) from the donor substrate (2) by thermally applying the stress-producing layer (4), thereby producing mechanical stress in the donor substrate (2), the mechanical stress creating a crack for separating a solid body layer (1), and the pressure application element (6) being pressed onto the stress-producing layer (4) during the thermal application of the stress-producing layer (4).

18 Claims, 6 Drawing Sheets

(52) U.S. Cl.
CPC ........ *B28D 5/0011* (2013.01); *H01L 29/1608* (2013.01)

(58) Field of Classification Search
USPC .......... 219/121.6, 121.67; 438/46, 460, 463; 264/400
See application file for complete search history.

(56) References Cited

U.S. PATENT DOCUMENTS

| | | | |
|---|---|---|---|
| 2013/0292691 A1* | 11/2013 | Henley | ................. H01L 31/028 438/460 |
| 2014/0197419 A1* | 7/2014 | Henley | ................. C30B 29/406 438/46 |
| 2016/0336233 A1 | 11/2016 | Yonehara et al. | |

FOREIGN PATENT DOCUMENTS

| | | | | |
|---|---|---|---|---|
| CN | 106041330 A | | 10/2016 | |
| DE | 102013016682 A1 | | 4/2015 | |
| DE | 102014013107 A1 | | 4/2015 | |
| DE | 102014002909 A1 | | 9/2015 | |
| DE | 102016201780 A1 | | 8/2016 | |
| DE | 102017003830 A1 | | 10/2018 | |
| JP | S59127985 A | | 7/1984 | |
| KR | 20130059677 A | * | 6/2013 | |
| WO | 2016083610 A2 | | 6/2016 | |
| WO | WO-2017167614 A1 | * | 10/2017 | ........... B23K 26/064 |

* cited by examiner

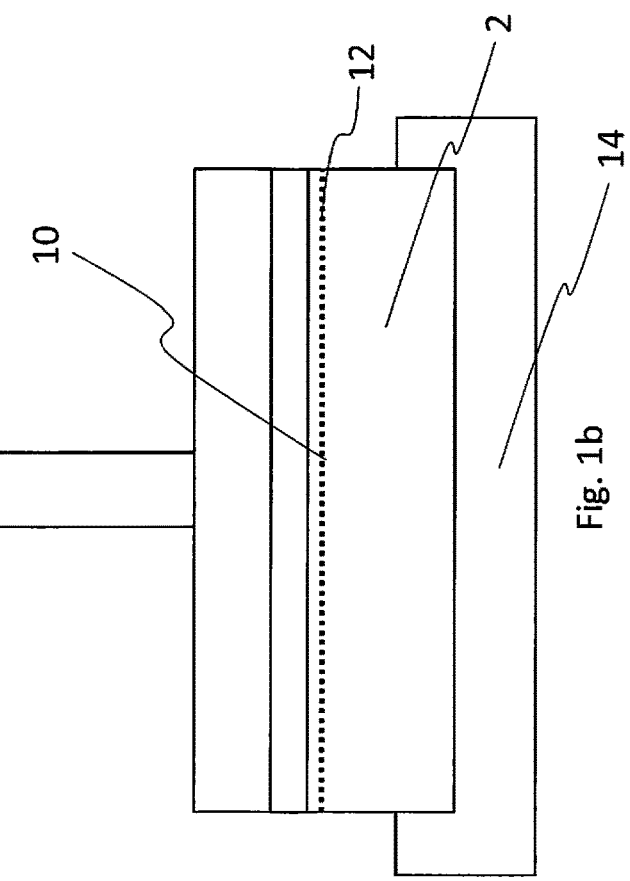
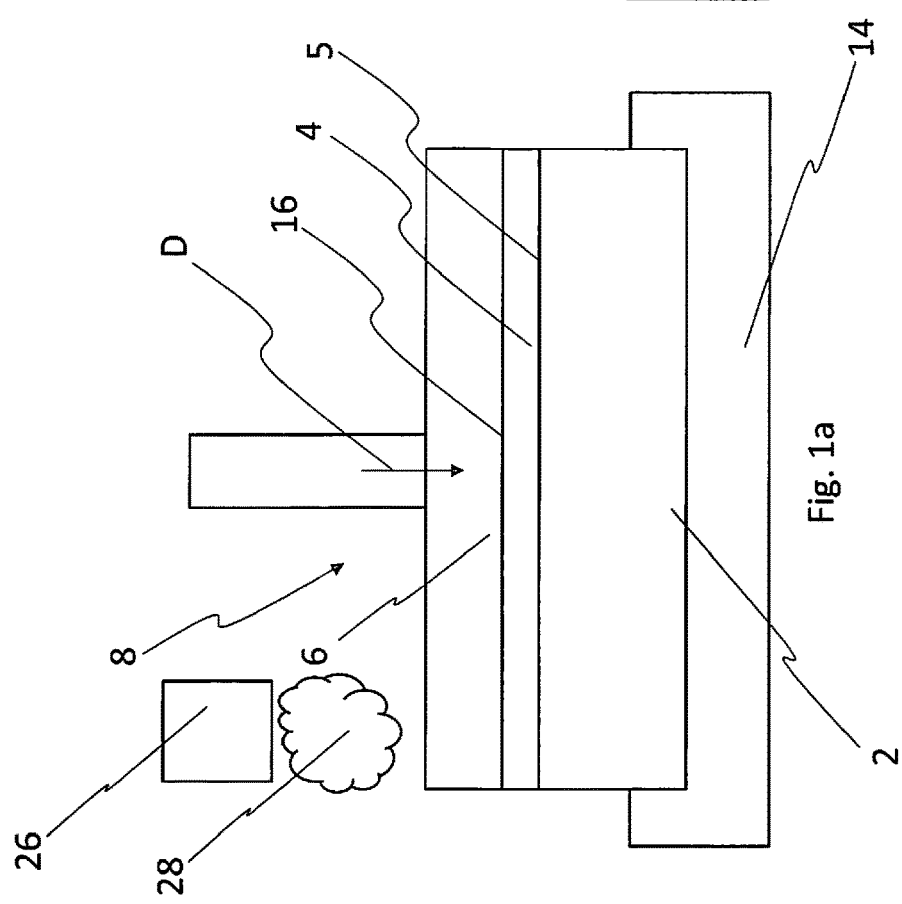

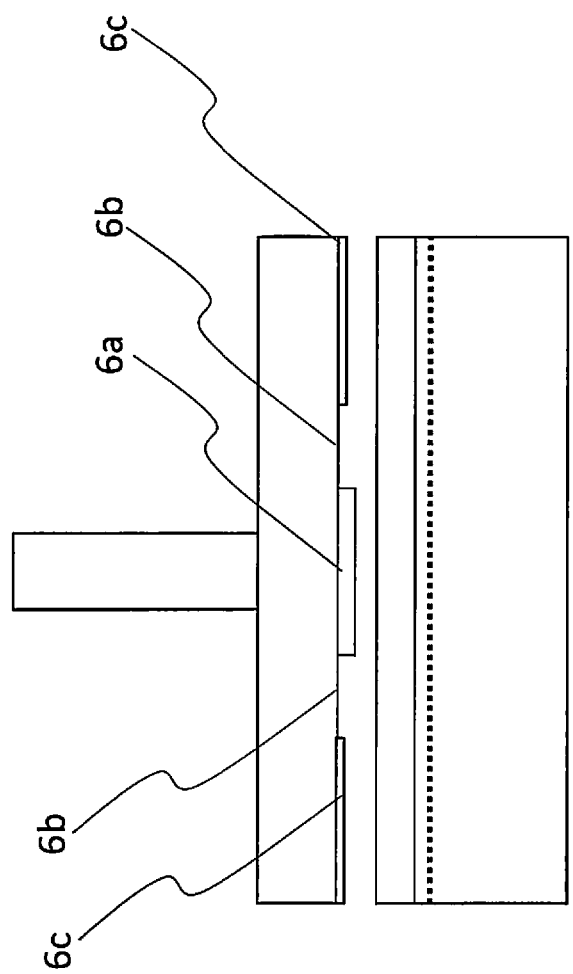

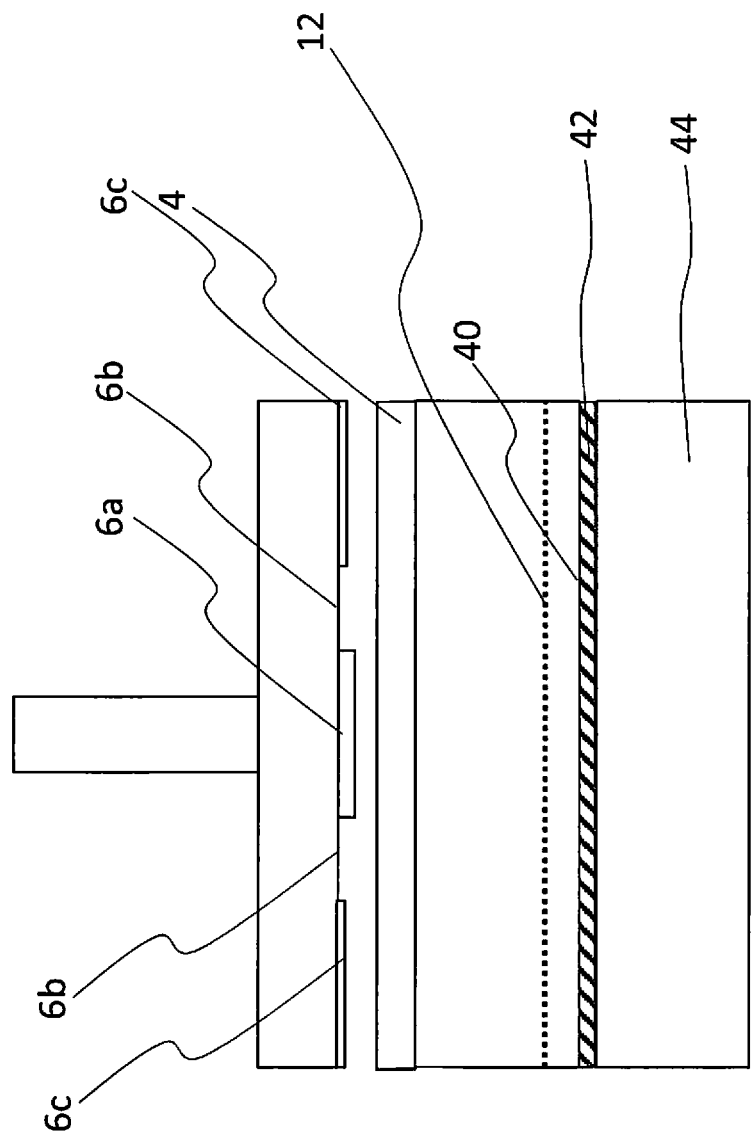

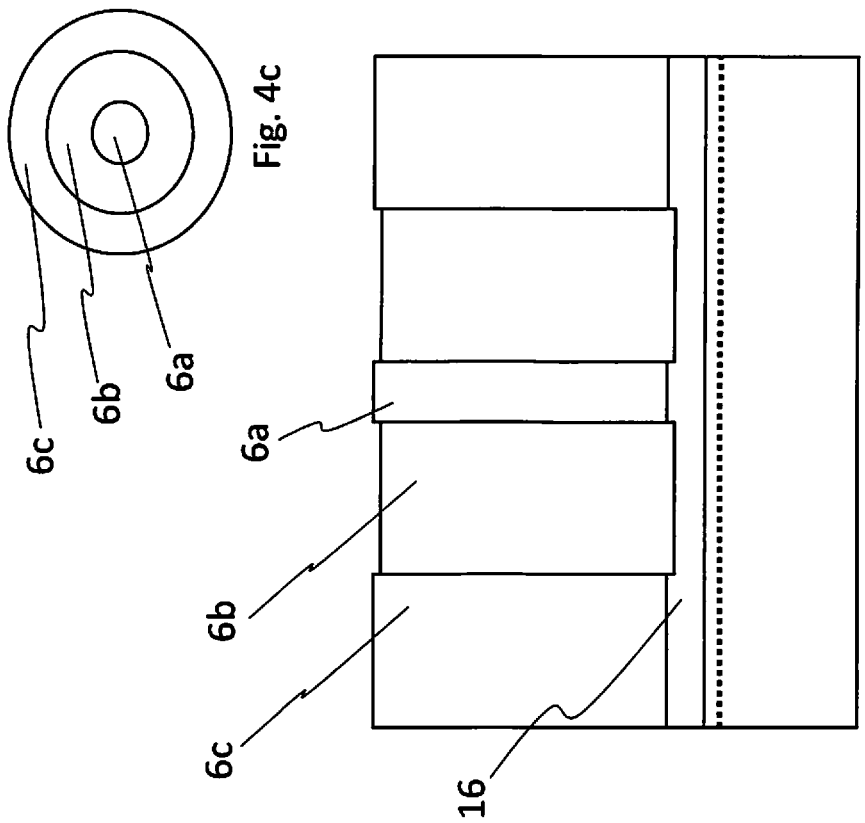
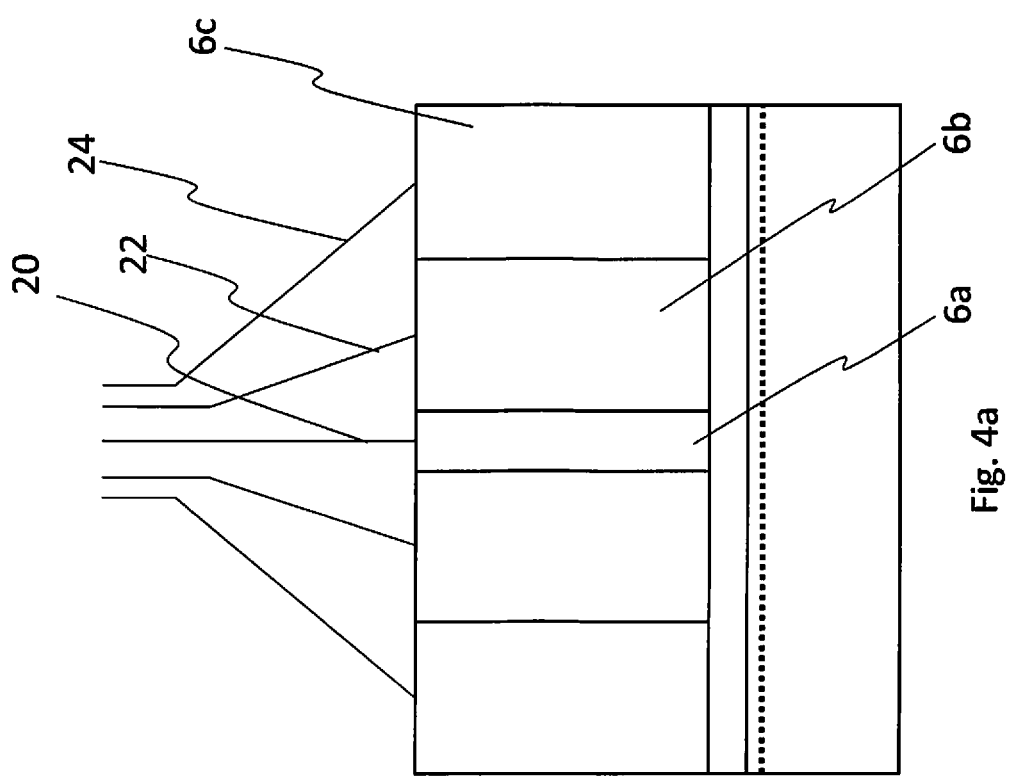

DEVICE AND METHOD FOR APPLYING PRESSURE TO STRESS-PRODUCING LAYERS FOR IMPROVED GUIDANCE OF A SEPARATION CRACK

The present invention relates to a method of separating at least one solid-state slice, especially multiple solid-state slices in succession, from a donor substrate and, to a system for separating solid-state wafers from a donor substrate.

Semiconductor materials are grown, for example, in large cylinders of crystalline material, called ingots, whereas industrial processes often require wafer material with different thickness and surface quality. Wafering of brittle semiconductor materials is frequently performed by diamond- or slurry-based wire sawing processes. These sawing processes lead not only to kerf loss of potentially valuable material but also surface roughness and, beneath the surface, to damage to the crystal. These aspects of wafering by sawing processes necessitate polishing and grinding steps in the wafer manufacturing process, leading to additional damage and process costs.

To address these problems in conventional wafering and thinning of semiconductors, what are called kerfless technologies have been developed, which promise a reduction in kerf losses, if not elimination, and of damage beneath the surface and grinding process steps. Particularly external "spalling" processes use stresses—often thermal stresses—crystalline materials along crystal planes of well-defined thickness to separate. Spalling can be effected with nickel-chromium alloys, silver-aluminum paste, epoxy resin, aluminum and nickel. Kerf-free wafering techniques have the potential to drastically reduce damage in semiconductor manufacturing processes. Stress-based removal techniques, such as spalling, use externally applied stresses to split crystalline materials along their crystal planes of well-defined thickness. However, substrates after spalling exhibit what are called Wallner lines which originate from the crack propagation in the crystal.

Spalling was enabled using differences in the coefficients of thermal expansion between a brittle material and a polymer adhering to the surface of the material. Cooling the bonded materials below the glass transition temperature of the polymer induces stresses that result in material splitting along a cracking plane. An advantage of this particular method as opposed to other modes of spalling is that the process of cooling does not cause elevated diffusion of unwanted chemical components through the material, by contrast with high-temperature processes that are also used for spalling.

However, spalling processes tend to be limited in terms of their control over the wafer thickness achieved, and tuning of the vertical location of the crack propagation is complicated.

Furthermore, spalling gives rise to very prominent patterns of Waliner lines on the surface. This pattern consists of stripy grooves and elevations which originate from the crack propagation in the semiconductor material and enable inference of the crack dynamics in the substrate. Typically, the crack begins at a certain point on the edge and then propagates rapidly from the edge of the substrate. Waliner lines of conventional spalling surfaces greatly increase the resulting surface roughness, often to the point where additional polishing or grinding steps are required prior to further processing and the production of circuits on the substrate.

The applicant's publication WO2016/083610 discloses laser-assisted separation of solid-state layers from donor substrates, especially examples of generation of modification.

Publication DE102016201780A1 discloses a method in which cracks are generated by means of laser beams for detachment of a wafer in an ingot. The detachment depends on an exposure to ultrasound. This method is disadvantageous because it is very fixed owing to its process parameters and also entails a high level of reprocessing complexity, and the reprocessing generates high costs and material losses.

It is thus an object of the present invention to provide a method of separating at least one solid-state slice from a donor substrate which is better than the known method, especially enables lower material losses.

The aforementioned object is achieved by a method of separating at least one solid-state slice, especially a solid-state wafer, from a donor substrate. The method of the invention preferably comprises at least the steps of: providing a donor substrate, generating or disposing a stress generation layer on a surface of the donor substrate, especially a flat surface, that axially bounds the donor substrate, pressing at least one pressurizing element of a pressurizing device onto at least one predetermined proportion of the stress generation layer for pressing the stress generation layer onto the surface, separating the solid-state slice from the donor substrate by subjecting the stress generation layer to thermal stress, which generates mechanical stresses in the donor substrate, and the mechanical stresses give rise to a crack for separation of a solid-state slice, wherein the pressurizing element is pressed onto the stress generation layer during the subjecting of the stress generation layer to thermal stress, as a result of which a reduction in the crack propagation rate is achieved.

This solution is advantageous since it has been recognized that the crack runs distinctly more accurately along a desired detachment region or a desired detachment plane or a desired detachment outline when a further force counteracts the mechanical stresses generated by the stress generation layer. This results from the fact that a vertical crack component is reduced or suppressed by the pressurization. This means that the departures of the crack from the plane or from the detachment plane are reduced and hence the result is a distinctly more planar crack progression, which increases the overall benefit/yield/output and/or can reduce the number of laser modifications or laser exposure. In other words, with the same or comparable laser exposure, the material losses are reduced or the laser processing time or laser utilization can be reduced with unchanged output. This solution is also advantageous since the splitting process, i.e. the period from commencement of heat treatment until complete detachment of the wafer or solid-state wafer, can be significantly reduced. This results from a distinct improvement in thermal coupling. The distinctly improved thermal coupling preferably results from the thermal stress on the donor substrate via the pressurizing element. The pressurizing element is preferably likewise used here to withdraw heat or to cool the donor substrate and/or the receiving layer, especially the polymer layer. The splitting process time can be shortened or significantly reduced from more than 10 min to less than 1 min. The shortened splitting process time is additionally advantageous since a distinct improvement in line control, i.e. of the subsequent treatments, especially consisting of laser exposure, disposing of a receiving layer on the donor substrate or laminating, performance of the splitting process and surface processing, especially grinding, of the surfaces generated or exposed as a result of the removal.

The solution of the invention is also advantageous since electronic components can be disposed or generated on the donor substrate and these are not damaged on splitting by a deformation of the solid-state layer or of the wafer, or the risk of damage can be significantly reduced. Thus, bending of the solid-state layer or of the wafer in the removal is reduced, especially completely avoided. In other words, the solid-state layer or wafer is preferably bent by less than 20° or less than 15° or less than 10° or less than 5° or less than 1° or less than 0.5°. Preferably, bending of the wafer or of the solid-state layer at least in the region or component exposed to the pressurization means is limited preferably to less than 20° or less than 15° or less than 10° or less than 5° or less than 1° or less than 0.5°.

The stress generation layer contracts as a result of the thermal stress, as a result of which tensile forces are introduced into the donor substrate by the stress generation layer. The pressure applied counteracts the tensile forces, which reduces force peaks and causes the crack to propagate in a distinctly more defined manner.

Further preferred embodiments are subject matter of the subsidiary claims and/or other parts of the description that follow.

In a preferred embodiment of the present invention, at least sections of the pressurizing element are in two-dimensional contact with the stress generation layer during the pressurization. Preferably, the pressurizing element covers more than 20% or more than 30% or more than 50% or more than 75% or more than 90% or the entirety of the surface that bounds the donor substrate in the axial direction, which is part of the solid-state layer after the removal. Preferably, the pressurizing element here abuts the stress generation layer disposed or generated on this surface. Preferably, the pressurizing element here is in contact with more than 20% or more than 30% or more than 50% or more than 75% or more than 90% of the surface area of the stress generation layer that covers the donor substrate in axial direction.

In a further embodiment of the present invention, the at least one pressurizing element generates the pressure in an edge region, wherein the edge region preferably comprises the outer 5% or 10% or 15% or 20% or 30% or 40% or 50% or 60% or 70% or 80% furthest from the center or closest to the edge of the surface in radial direction of the stress generation layer disposed on the donor substrate, and/or the at least one pressurizing element generates the pressure in a center region, wherein the center region preferably comprises the inner 5% or 10% or 15% or 20% or 30% or 40% or 50% or 60% or 70% or 80% closest to the center or extending toward the center of the surface of the stress generation layer disposed on the donor substrate in radial direction, or the at least one pressurizing element generates the pressure over the entire two-dimensional proportion of the surface area of the donor substrate on which the stress generation layer is disposed. This embodiment is advantageous since the pressure for influencing the crack propagation can be applied as required.

In a further preferred embodiment of the present invention, the pressurizing element exerts a compression force, depending on the substrate diameter, of at least 10 N, especially between 100 N and 3000 N or between 3000 N and 10 000 N or up to 100 kN on the stress generation layer.

This solution is advantageous since, firstly, the forces generated by the stress generation layer can be counteracted in a controlled manner and, secondly, crack propagation and crack triggering is nevertheless possible.

In a further preferred embodiment of the present invention, the pressurizing element is disposed so as to be movable and is deflected relative to the donor substrate preferably as a result of the thermal stress on the stress generation layer by the stress generation layer, or the donor substrate is disposed so as to be movable and is deflected relative to the pressurizing element as a result of the thermal stress on the stress generation layer by the stress generation layer. The pressurizing element and/or the donor substrate is preferably deflectable and/or movable in axial direction of the donor substrate. In a further preferred embodiment of the present invention, the pressurizing element is only deflected once a predefined minimum force is exceeded. This embodiment is advantageous since the predefined minimum force makes it possible to very precisely adjust the extent to which force peaks that occur are to be reduced.

In a further preferred embodiment, a multitude of pressurizing elements is provided, wherein the individual pressurizing elements serve to apply locally different pressures and/or have different shapes and/or contact area dimensions and/or are deflectable to different extents and/or are deflectable with different forces. This embodiment is advantageous since a multitude of parameters can be employed for optimal adjustment of the pressurization.

In a further preferred embodiment of the present invention, the pressurizing element or the pressurizing elements can be pressed against the stress generation layer to generate a predefined contact pressure profile, wherein the contact pressure profile depends at least in sections on the distance of pressure application to the axial center of the donor substrate and/or on the crack propagation speed and/or the thermal stress and/or on the material of the donor substrate and/or on a conditioning of the donor substrate, especially by means of laser beams.

In a further preferred embodiment of the present invention, the pressurizing element exerts a compression force in each case of at least 10 N, especially between 100 N and 3000 N or between 3000 N and 10 000 N or up to 100 kN on the stress generation layer. Preferably, the pressurization, in the case of two pressurizing elements used simultaneously, may differ by a factor of up to or at least 0.1 or of up to or at least 0.3 or of up to or at least 0.5 or of up to or at least 0.75 or of up to or at least 1.5 or of up to or at least 2 or of up to or at least 5 or of up to or at least 10 or of up to or at least 20. Thus, the pressurizing elements are not deflected until predefined minimum forces have been exceeded. This embodiment is advantageous since the predefined minimum forces make it possible to very precisely adjust the extent to which force peaks that occur are to be reduced by the individual pressurizing elements.

In a further preferred embodiment of the present invention, the stress generation layer comprises or consists of a polymer material, wherein the polymer material has a glass transition temperature below 20° C., especially below 10° C. or below 0° C., and wherein the polymer material is cooled down to a temperature below the glass transition temperature, wherein the glass transition that occurs generates the mechanical stresses in the donor substrate.

At least one of the pressurizing elements or the holding device on the side of the stress generation layer additionally has one or more heating elements, which means that the thermal stress on the stress generation layer on completion of separation can rapidly be reversed again above the glass transition temperature. This can ensure that, after the deflection of the pressurizing elements, no significant deformation of the solid-state slice removed leads to any fracture.

In a further preferred embodiment of the present invention, there is a reduction in the exposure to force after the split only after the stress generation layer has been heated up, especially to a temperature above the glass transition temperature, especially to a temperature of at least 10° C. or at least 20° C. or at least 30° C. or at least 50° C. above the glass transition temperature and/or up to 100° C. above the glass transition temperature. Alternatively, the exposure to force may be reduced depending on an increase in temperature of the stress generation layer. The stress generation layer here may be heated by means of a heating device, especially microwave radiation and/or heated air and/or a heating element.

In a further preferred embodiment of the present invention, the stress generation layer, in terms of mass, at least mainly and preferably entirely includes or consists of a polymer material, where the glass transition of the polymer material is between −100° C. and 0° C., especially between −85° C. and −10° C. or between −80° C. and −20° C. or between −65° C. and −40° C. or between −60° C. and −50° C.

The stress generation layer preferably consists of or includes a polymer hybrid material which more preferably forms a polymer matrix, where there is a filler in the polymer matrix, where the polymer matrix is preferably a polydimethylsiloxane matrix and where the proportion by mass of the polymer matrix in the polymer hybrid material is preferably 80% to 99% and more preferably 90% to 99%.

The stress generation layer is preferably provided as a prefabricated film and is coupled, especially stuck or bonded, to the solid-state body.

According to the invention, therefore, a polymer hybrid material is specified for use in a splitting method in which at least two solid-state fragments are generated from a solid-state starting material. The polymer hybrid material of the invention comprises a polymer matrix and at least one first filler embedded therein. Where mention is made hereinafter of a or the filler, the possibility of multiple fillers shall likewise be included. For example, the filler may comprise a mixture of different materials, e.g. metal particles and inorganic fibers.

The polymer matrix utilized may be any polymer or a mixture of different polymers, with the aid of which it is possible to generate the stresses needed for a division of the solid-state starting material. For example, the polymer matrix may take the form of an elastomer matrix, preferably of a polydiorganosiloxane matrix, more preferably of a polydimethylsiloxane matrix. Such polymer materials can be utilized in a particularly simple manner as matrix material in combination with fillers since the properties can be flexibly adjusted owing to the variable degree of crosslinking and matched to the respective filler and the solid-state starting material to be divided. In one embodiment, the proportion by mass of the polymer matrix in the polymer hybrid material is 80% to 99%, 10 preferably 90% to 99%.

The first filler may be organic or inorganic in nature and may consist either of a chemical element or of a chemical compound or of a mixture of substances, for example an alloy.

The constitution of the first filler is such that it acts as reactant, initiator, catalyst or promoter during the detachment of the polymer hybrid material from the solid-state fragment after the division and hence leads, by comparison with a polymer material without first filler, to faster detachment of the polymer hybrid material from the solid-state fragment after the division.

The specific chemical composition and configuration of the first filler and the proportion by mass thereof is dependent especially on the specific material of the polymer matrix that is to be detached, the solvent utilized for the purpose, and the reactants used. In addition, the material of the solid-state starting material and the dimensions of the solid-state starting material to be divided also play a role.

The specific proportion of the first filler in the polymer matrix is highly dependent on the filler material and its mode of action. Firstly, the polymer matrix, in spite of the filler, must still fulfill its function of generating stresses. Secondly, the proportion of the first filler must be high enough to achieve the desired influence on the removal of polymer. The optimal proportion by mass of the first filler in each case can be ascertained by the person skilled in the art in simple experiments conducted in a concentration-dependent manner.

A contribution to an improvement in mechanical properties may additionally be made by a further filler, for example fumed silica in the form of an inorganic network in the polymer. As well as these strong interactions in the form of the network, it is also possible for less strong interactions to make a contribution to the improvement via purely hydrodynamic reinforcements. An example that may be mentioned here is a controlled increase in viscosity that enables improved processing in the splitting method and hence can contribute to improved manufacturing tolerances. In addition, this interaction makes it difficult for there to be any reduction in the internal degrees of freedom with regard to structural reorientation with increasing reinforcement.

This leads to a desired lowering of the glass transition temperature of the polymer used in the polymer hybrid material, which enables the advantage of a lower temperature in the splitting method. According to the invention, the first filler in a polymer hybrid material is used for acceleration of the detachment of the polymer hybrid material from a solid-state fragment which is obtained by division by means of a splitting method in which a solid-state starting material is divided into at least two solid-state fragments.

The first filler may be distributed in the polymer matrix in such a way that the proportion by mass of the first filler decreases proceeding from the outer, i.e. lower, interface of the polymer hybrid material which is joined to the solid-state starting material during the splitting method in the direction of a further interface of the polymer hybrid material arranged parallel to the lower interface. This means that the proportion by mass of the filler close to the solid-state starting material or fragment is greater than in the other regions of the polymer hybrid material. This distribution of the first filler enables particularly effective removal of the polymer hybrid material after the separation since the first filler is close to the interface to the solid-state fragment and can display its effect there. At the same time, the remaining regions of the polymer hybrid material include less or even zero fractions of the first filler, such that there is a minimum influence on the function of the polymer.

In one configuration, the polymer hybrid material has a layered construction, with only a layer facing the solid-state starting material including the first filler, while the rest of the polymer hybrid material is free of the first filler.

In addition, a lower region of the polymer hybrid material that directly adjoins the lower interface thereof may be free of the first filler. Thus, the resultant sequence of regions may be as follows: adjacent to the solid-state starting material is firstly a region with no first filler, followed by a region with a high proportion of first filler and then by a region having a low proportion of first filler or having no first filler.

These and all the regions described hereinafter may take the form of layers, meaning that the region extends predominantly parallel to the interface of the solid-state starting material to which the polymer hybrid material is applied and has a longitudinal and transverse extent at least in the region of this interface.

A lower region without first filler may especially be provided if the first filler worsens the adhesion of the polymer hybrid material to the solid-state starting material. In order to avoid this, a region without first filler is first disposed, followed by a region with a high proportion of first filler in order that the first filler can fulfill its function. A lower region without first filler may have a thickness, for example, between 10 μm and 500 μm, for example 100 μm.

In addition, an upper region of the polymer hybrid material that directly adjoins the upper interface thereof may be free of the first filler. The lower interface is understood to mean the interface that bounds the polymer hybrid material from the environment at the opposite side from the lower interface and from the solid-state starting material. The upper and lower interface may be arranged parallel to one another.

Such an upper region without first filler may be provided especially when the first filler adversely affects the heat transfer between the environment and polymer hybrid material, for example if the cooling of the polymer hybrid material were to be delayed.

The first filler may comprise or consist of a material that can react with a reactant, preferably an oxidant, with release of a gaseous product.

It is thus possible to generate cavities in the polymer matrix that enable faster access by the reactants and solvent to the polymer matrix and any sacrificial layer present and additionally bring about faster transporting-away of the reactants and dissolved constituents.

The generation of gaseous reaction products can introduce additional driving forces that further assist the removal of the polymer hybrid material.

The formation of additional cavities and of gaseous reaction products accelerates the removal of polymer and therefore contributes to an increase in the overall yield of the splitting method. By varying the proportion of first filler, it is possible to influence the cavity density in the interface region between solid-state fragment and polymer hybrid material or between sacrificial layer and polymer hybrid material in a controlled manner.

The first filler may comprise a metal, especially aluminum, iron, zinc and/or copper, or consist of a metal, especially the aforementioned metals.

In relation to all the materials mentioned in the present context, "consisting of" includes the possibility that impurities for technological reasons or additions for technological reasons that may serve, for example, for production of the fillers and their distribution or binding to the polymer matrix may be present.

Metallic fillers may react with oxidizing agents, for example hydrochloric acid, nitric acid, citric acid, formic acid or sulfamic acid, with release of a gaseous product and hence be removed from the polymer hybrid material.

For example, aluminum reacts with concentrated hydrochloric acid to form solvated metal ions and hydrogen according to the following equation: $6\ HCl + 2\ Al + 12H_2O \rightarrow 2\ [AlCl_3 \cdot 6\ H_2O] + 3H_2$ In a similar manner, the reaction of zinc as filler by reaction with concentrated hydrochloric acid leads to formation 5 of additional cavities: $Zn + 2\ HCl \rightarrow ZnCl_2 + H_2$ In the examples mentioned, the generation of hydrogen introduces additional driving forces that further assist the removal of the polymer hybrid material. In addition, the first filler can improve the thermal conductivity within the polymer hybrid material, for example in that the first filler has a higher thermal conductivity than the polymer of the polymer matrix. This may be the case, for example, when A further advantage in the case that the first filler comprises a metal lies in the improved thermal conductivity within the polymer hybrid material. Thereby By virtue of an improved thermal conductivity are the stresses generated by means of cooling for the division of the solid-state starting material are generatable more effectively, i.e. more quickly and with lower consumption of coolant. This increases can increase the overall yield of the splitting method.

In addition, a second 25 filler may be provided in the polymer hybrid material, which increases the adhesion of the polymer hybrid material on the solid-state starting material by comparison with a polymer hybrid material without second filler. Preferably, the adhesion is increased by comparison with a polymer material without filler.

For example, the second filler may be a filler that can be activated by means of plasma. Plasma activation results in new surface species that can be created so as to result in stronger interaction with the surface of the solid-state starting material and, ultimately, the adhesion of the polymer hybrid material is improved.

The nature of the surface species achievable by the plasma treatment is dependent primarily on the process regime of the plasma process. For example, during the plasma treatment, gases such as nitrogen, oxygen, silanes or chlorosilanes may be added, so as to give rise to polar groups, for example, which can interact more strongly with the surface of the solid-state starting material.

The second filler may be distributed 15 in the polymer matrix in such a way that the proportion by mass of the second filler increases in the direction of the lower interface. For example, the polymer hybrid material may contain the second filler only in a region adjoining the lower interface, where the region may also take the form of a layer in the sense of the abovementioned definition.

This enables the arrangement of the second filler preferably close to the interface between polymer hybrid material and solid-state starting material, which improves the adhesion and hence enables better force transmission into the solid-state starting material to be divided. For example, the second filler may comprise core-shell polymer particles.

Preference is given here to particles having a polymer composition that differs from the polymer matrix of the polymer hybrid material in that the surface, i.e. the shell, of the core-shell particles in particular is more strongly activatable, for example by means of low-temperature plasma.

Examples of these are core-shell particles comprising a polysiloxane core with an acrylate shell or comprising a nanoscale silicate core with an epoxide shell or comprising a rubber particle core with an epoxide shell or comprising a nitrile rubber particle core with an epoxide shell. The second filler may be activatable by means of low-temperature plasma, for example cold plasma. For example, the plasma may be generated by means of dielectric barrier discharge (DBD). It is possible here to generate electron densities in the range from 1014 to 1016 $m^{-3}$. The average temperature of the "cold" non-equilibrium plasma (plasma volume) generated by DBD is about 300±40 K at ambient pressure.

The average temperature of the non-thermal plasma generated by DBD is about 70° C. at ambient pressure.

In the case of DBD treatment, the surface is subjected, for example, to uni- or bipolar pulses of pulse durations of a few microseconds to a few tens of nanoseconds and amplitudes in the single-digit to double-digit kilovolt range. No metallic electrodes are to be expected here in the discharge space, and hence no metallic impurities or electrode wear.

A high efficiency is additionally advantageous since no charge carriers have to exit from or enter the electrodes.

Dielectric surfaces may be modified and chemically activated at low temperatures. The surface modification can be effected, for example, by an interaction and reaction of the surface species by ion bombardment.

In addition, it is possible to specifically add process gases, for example nitrogen, oxygen, hydrogen, silanes or chlorosilanes, e.g. SixHyEz with E=F, Cl, Br, I, O, H and x=0 to 10, z=0 to 10, SiH4, Si(EtO)4 or Me3SiOSiMe3, in a plasma treatment in order to generate, for example, particular chemical groups at the surface. The second filler may additionally be activatable by means of corona 5 treatment, flame treatment, fluorination, ozonization or UV treatment, or excimer irradiation. Such activation generates polar groups, for example, at the surface of the second filler, which can interact with the surface of the solid-state starting material and hence improve the adhesion. The polymer hybrid material may also additionally, by comparison with a polymer hybrid material having a first filler or with a polymer hybrid material having a first and second filler, comprise a third filler. This third filler has higher thermal conductivity and/or a higher modulus of elasticity compared to the polymer of the polymer matrix.

For example, the modulus of elasticity of the polymer under low-temperature conditions is in the lower single-digit gigapascal range (about 1-3 GPa), whereas, for example, metallic fillers have a modulus of elasticity in the double-digit to triple-digit gigapascal range. In the case of a corresponding high filler content, a percolating filler network is possible, which enables improved introduction of force into the solid-state starting material.

The percolation is significantly influenced by the degree of volume filling of the respective fillers (e.g. 0.1% by volume, 1 30% by volume to 10% by volume according to the aspect ratio). With increasing introduction of force, the viscoelastic layer construction of the polymer structure can be immersed and multiple percolation pathways become active. It is possible here to enable improved heat transfer since there can be improved contact of the fillers with the surface of the solid-state starting material.

The mechanical stability of the polymer hybrid material is rapidly attained even at low temperatures. The overall result is a lower standard deviation in the corresponding profiles of structure properties, for example breaking stress and elongation at break of the polymer hybrid material, and hence an increase in the overall yield of the splitting method. The spatially resolved changes in the profile of properties (tension peaks in the polymer hybrid material) and hence in the solid-state body are smaller, which leads to a higher overall yield of the splitting method and a better quality of the solid-state fragments produced.

The third filler can bring about improved heat transfer between the environment and polymer hybrid material and faster conduction of heat within the polymer hybrid material, such that the polymer hybrid material can be cooled more quickly and the splitting method can be performed rapidly and hence more effectively overall.

An increase in the modulus of elasticity can achieve higher stresses for the division of the solid-state starting material, such that it is also possible to divide solid-state starting materials for which particularly high stress is required.

Moreover, the third filler can also serve to influence the coefficient of thermal expansion. The aim here is a maximum difference between the coefficients of thermal expansion of the polymer hybrid material and the solid-state starting material to be divided, in order to be able to generate stresses necessary for the division. Preferably, the third filler has a high coefficient of thermal expansion, i.e. a coefficient of expansion higher than that of the polymer matrix. For example, the coefficient of thermal expansion of the third filler may be more than 300 ppm/K.

The third filler may be distributed in the polymer matrix such that the proportion by mass of the third filler increases in the direction of the upper interface in order to enable more rapid heat transfer especially at the interface to the environment.

The third filler may comprise a metal, especially aluminum, iron, zinc and/or copper, or consist of one of the metals mentioned. Metals are generally notable for a high heat conductivity and thermal conductivity.

The fillers described (first, second, third filler) may be distributed in particulate form in the polymer matrix, and the particle size may be in the μm and nm range, based on at least one dimension of the particle. As well as a spherical shape, the filler particles may also assume different configurations, for example a rod or disk shape.

The filler particles may have any particle size distribution, for example monomodal or bimodal, narrow, especially monodisperse, or broad. The fillers may be either physically bound, for example by embedding into the polymer network, or chemically bound to the polymer matrix. In addition, one or more of the fillers described may comprise or consist of inorganic or organic fibers, for example carbon, glass, basalt or aramid fibers, provided that the functions described above are reconcilable therewith. It is optionally also possible to add a further filler that comprises or consists of the fibers mentioned.

Fibers typically have strongly anisotropic properties. By direction-dependent positioning of the filler in the polymer hybrid material, it is possible to influence the stresses needed for the division of the solid-state starting material in a controlled manner. This can contribute to an increase in the overall yield of the splitting method. An additional advantage, in the case that an organic or inorganic filler is used as fibrous material having a strongly anisotropic structure, is that this can achieve an improvement in the mechanical properties within the polymer hybrid material.

The fillers described may additionally comprise or consist of core-shell particles. Additionally or alternatively, a further filler comprising or consisting of core-shell particles may be provided in the polymer hybrid material.

The use of core-shell polymer particles additionally allows, as well as improved activatability, also a new configuration of energy-absorbing mechanisms that can lead overall to an increase in impact resistance and fracture toughness, especially an increase in low-temperature fracture resistance, of the polymer hybrid material in the case of use in the splitting method, and hence can likewise contribute to a higher overall yield of the splitting method. For example, mechanical destruction of a film of a polymer hybrid material may be less likely to occur, and so the possibility of reuse of the film can be promoted.

By way of example, by preventing crack propagation owing to core-shell polymer particles, it is possible to prevent destruction of the film in the splitting method and hence to open up reutilization pathways.

It is possible here for elastomer particles present to undergo plastic deformation and form cavities, which means that further additional energy can be absorbed. Additional absorption of energy can likewise be compensated for by the shear flow of the matrix, which improves mechanical properties overall. It is a feature of core-shell particles that a generally spherical core made of one material is surrounded by a shell made of a second material. The shell may either completely surround the core or alternatively be permeable. The materials may either be inorganic materials, for example metals, or organic materials, for example polymers. For example, it is possible to combine two different metals with one another. Alternatively, it is possible to surround a core made of a polymer with a shell made of a metal or a second polymer.

Core-shell particles enable the combination of the properties of the first and second materials. For example, by means of an inexpensive polymer core, it is possible to fix the size and density of the filler particles, while the metallic shell can react as described above. Owing to their often monodisperse particle size distribution, the properties of the core-shell particles can additionally be precisely predicted and adjusted.

Furthermore, one or more fillers (first, 5 second and/or third filler) may comprise or consist of carbon in the form of carbon black, graphite, chopped carbon fibers, carbon nanofibers, preferably in the form of carbon nanotubes (CNTs), for example multiwall carbon nanotubes (MWCNTs) and single-wall carbon nanotubes (SWCNTs). Carbon nanotubes are cylindrical graphite layers formed from a different number of cylinders.

If these tubes consist of just one cylinder, they are referred to as single-wall carbon nanotubes (SWCNTs). If two or more cylinders are present, the result is either double-wall carbon nanotubes (DWCNTs) or multiwall carbon nanotubes (MWCNTs). These may preferably be in concentrically nested form.

In various embodiments, the third filler may comprise or consist of MWCNTs since these have particularly high thermal conductivity (>3000 W*(m*K)−1) and at the same time have very high tear resistance in the range of 5-60 GPa. The high mechanical stability is manifested in high tear resistance values, extreme elasticity and very good durability of the filler.

This is based on the sp2-hybridized strong σ-C—C bonds combined with a delocalized p orbital as the π bond to there adjacent carbon atoms. Torsions of up to 90° are possible here.

SWCNTs can achieve even higher property values (modulus of elasticity: 410 GPa to 4150 GPa vs. graphite: 1000 GPa, SWCNTs: thermal conductivity about 6000 W*(m*K)−1). However, a poorer cost/benefit ratio is found here compared to MWCNTs. The cylinder diameters of MWCNTs are typically in the range from 1 nm to 100 nm, preferably from 5 to 50 nm, with a length of 500 nm to 1000 μm.

In further embodiments, the third filler may comprise MWCNTs and, at the same time, the second and/or first filler may comprise or consist of carbon black, since it is likewise possible here to achieve an improvement in thermal conductivity (for example up to 200 W*(m*K)−1). Since the use of carbon black, by way of example, has a distinctly lower tear resistance with values of <0.4 GPa, a combination of both or further fillers is possible and can lead to an improvement in the overall splitting yield and to an improvement in the overall costs in the splitting method.

20 The average diameter here of the carbon black particles is in the range from 5 nm to 500 nm, preferably from 20 nm to 200 nm, more preferably from 40 nm to 100 nm.

In addition, the fillers may comprise or consist of silica, for example fumed silica. 25 Additionally or alternatively, a further filler comprising or consisting of silica may be provided in the polymer hybrid material.

Fumed silica may form a three-dimensional network and hence contribute to an improvement in mechanical 30 stability. Thus, such a filler may serve for controlled adjustment of the mechanical properties of the polymer hybrid material. One or more of the fillers mentioned (first, second, third filler) may consist of the same material if it is reconcilable with the function ascribed to it. For example, both the first and third fillers may comprise aluminum or consist of aluminum. Aluminum can be utilized as described above both for generation of cavities and hence for acceleration of the detachment of the polymer hybrid material from the solid-state fragment and for an increase in thermal conductivity. Such a configuration simplifies the manufacturing process since it may be sufficient to add just one or two fillers in order to fulfill all functions.

The first and second and any third filler may also consist of different materials. This enables individual and hence better adaptation of the filler to the desired function.

A film of the invention comprises a polymer hybrid material as described above. The film may have a thickness of, for example, 0.5 to 5 mm.

A polymer hybrid material of the invention or a film of the invention is applied to at least this surface, so as to result in a corresponding composite structure. The polymer hybrid material applied and the film applied are also referred to hereinafter as stress generation layer. The thickness of such a stress generation layer may, for example, be between 0.5 mm and 5 mm, especially between 1 mm and 3 mm. Optionally, the polymer hybrid material or film may be applied to multiple exposed surfaces, especially to surfaces in a mutually parallel arrangement.

The thermal stress preferably constitutes cooling of the stress generation layer below ambient temperature and preferably below 10° C. and more preferably below 0° C. and further preferably below −10° C. or below −40° C.

The cooling of the stress generation layer is most preferably effected in such a way that at least some of the stress generation layer undergoes a glass transition. The cooling here may be a cooling operation to below −100° C., which can be brought about, for example, by means of liquid nitrogen. This embodiment is advantageous since the stress generation layer contracts and/or undergoes a glass transition as a function of the change in temperature and the resultant forces are transmitted to the solid-state starting material, by means of which mechanical stresses can be generated in the solid-state body and lead to triggering of a crack and/or to crack propagation, with spreading of the crack initially in the first detachment plane for splitting-off of the solid-state layer. In a further preferred embodiment, a phase transformation holding layer is implemented in the region of the contact area with the pressurizing element of the pressurizing device. A phase transformation substance to be selected is implemented here between the single-sidedly or double-sidedly laminated polymer hybrid material solid-state composite structures to be separated and the contact surfaces with the pressurizing element. It is possible here for the phase transformation holding layer to be implemented either only on the bottom side or only on the top side or else on both sides facing the pressurizing element.

In each case, depending on the phase transformation substance used, the two contact surfaces are cleaned and modified close to the surface in order to ensure optimal adhesion and spreading of the phase transformation substance at the time of loading (polar and nonpolar surface).

After the pressurizing device has been laden with the polymer hybrid material solid-state composite structure, there is a dedicated change in temperature in which the phase transformation substance undergoes a phase transition from the liquid to the solid state of matter. After undergoing the phase transition, the firmly adhering phase transformation substance now in solid form can additionally fix the polymer hybrid material solid-state composite structure on the pressurizing element and thus lower the geometric degrees of freedom of the polymer hybrid material solid-state composite structure and hence influence improved crack propagation and crack dynamics in preferably only one and/or two spatial direction(s).

Specifically for thin solid-state layers (<100 µm), it is particularly advantageous, in the period after the successful split, to counteract the bending of the separated polymer hybrid solid-state layer by the adhesion with the aid of the phase transformation substance. This leads to an increase in the splitting yield in the overall process.

The surface modification of the contact surfaces in the polar case can preferably be implemented by a plasma treatment, corona treatment, plasma by means of dielectric barrier discharge (DBE), UV treatment, excimer irradiation or else by ozonization.

Thus, the necessary surface properties can be adjusted such that the more preferably strongly polar embodiment of the phase transformation layer (e.g. water, acetonitrile, tertiary alcohols, primary and secondary amides, trichloromethane, tetrahydrofuran) cause a particularly preferred increase in surface energy and hence enable improved binding.

In a further preferred embodiment, the contact surface in the region of the pressurizing element may be chosen such that there is elevated micro-roughness that enables improved adhesion of the phase transformation substance owing to the increase in contact surface area.

In a further working example, the phase transformation substance may be used in the form of a melt-applied adhesive, for example natural resins such as mastic, copal, dammar or else rosin (nonpolar case). In this case, the phase transformation is in the reverse sequence from the solid to the liquid state of matter. The melt-applied adhesive is melted here and bonded to the pressurizing device and the polymer hybrid material solid-state composite structure and hence the holding function is achieved. In the nonpolar case, the necessary surface functionalization can be effected, for example, by a silanization.

In a further step, the polymer hybrid material or the film is removed from the solid-state fragment, for example by a chemical reaction, a physical detachment operation and/or mechanical material removal.

The operation of detachment of the polymer hybrid material from the solid-state fragment can take place at moderate ambient temperature, for example in the range from 20° C. to 30° C., preferably in the higher temperature range from 30° C. to 95° C., for example from 50° C. to 90° C., or else, for example, in a lower temperature range between 1° C. and 19° C.

The elevated temperature range can enable shortening of a chemical detachment reaction owing to an increase in the reaction rate, for example in the case of use of a sacrificial layer between the polymer hybrid material and the solid-state body. In the case of use of a sacrificial layer, the detachment can be effected in aqueous solution, advantageously at a pH in the range of 2-6. In various embodiments, by way of example, the detachment operation can be effected in the form of a treatment with a solution of a suitable apolar solvent, particular preference being given to moderate ambient temperatures in the range from 1° C. to 50° C. and particular preference to from 20° C. to 40° C.

A particular advantage here is detachment without thermal treatment of the film. It is advantageously possible here to employ aliphatic and aromatic hydrocarbons, for example toluene, n-pentane, n-hexane, but also halogenated solvents, for example carbon tetrachloride. It is possible here to introduce additional forces into the polymer hybrid material to be detached and the interface to the solid-state fragment since a solvent treatment can result in occurrence of very significant reversible swelling of the polymer hybrid material, which simplifies detachment overall.

In further embodiments, a combination with the above-described mechanism of detachment of the sacrificial layer and treatment with a suitable apolar solvent can be effected likewise without thermal treatment of the film.

The material is preferably removed here in longitudinal direction of the solid-state body.

In a further preferred embodiment of the present invention, the pressure for adjusting the propagation rate, especially average propagation rate, of the main crack is adjusted. The pressure is preferably adjusted or set here in such a way that the propagation rate, especially the average propagation rate, of the main crack in radial direction of the donor substrate is less than 5 cm/second or less than 3 cm/second or less than 1 cm/second, especially less than 0.5 cm/second and preferably less than 0.1 cm/second. The average propagation rate of the main crack in radial direction of the donor substrate is thus preferably between 0.5 cm/second and 0.1 cm/second, especially between 0.4 cm/second and 0.15 cm/second or between 0.35 cm/second and 0.2 cm/second. This embodiment is advantageous since a slow crack propagation rate can bring about very precise crack guidance.

In a further preferred embodiment of the present invention, the method comprises the step of conditioning the donor substrate. The conditioning of the donor substrate, preferably by means of laser beams, generates modifications within the donor substrate, wherein the modifications define a detachment region along which the solid-state slice is separated from the donor substrate. The laser beams preferably penetrate here into the donor substrate via the surface area of the donor substrate that is part of the solid-state slice removed after the removal. This embodiment is advantageous since it is possible to very precisely define a detachment region or a detachment plane or a detachment contour for guidance of the crack. The modifications are generated here preferably by multiphoton excitation, especially two-photon excitation. A modification preferably constitutes a phase transition of a starting material. For example, SiC can be converted to Si and C. Si and C have a greater volume than SiC, which means that the transformation gives rise to compressive stresses.

In a further preferred embodiment of the present invention, the donor substrate has crystal lattice planes inclined relative to a flat main surface, where the main surface bounds the donor substrate on one side in longitudinal direction of the donor substrate, with a crystal lattice plane normal inclined in a first direction relative to a main surface normal, wherein the laser beams are introduced into the donor substrate via the main surface in the region of at least one laser focus to alter the material properties of the donor substrate, or into the donor substrate to generate modifications in the donor substrate, wherein the laser focus is formed by the laser beams emitted by a laser, wherein the change in the material property forms a linear design by altering the penetration site of the laser beams into the donor substrate, wherein the changes in the material property are generated in at least one generation plane, wherein the crystal lattice planes of the donor substrate are in an inclined alignment relative to the generation plane, wherein the linear design is inclined relative to an interface line that arises at the interface between the generation plane and the crystal lattice plane, wherein the altered material property causes the donor substrate to tear in the form of subcritical cracks, wherein the mechanical stresses cause the subcritical cracks to be joined to one another by a main crack, as a result of which the solid-state slice becomes detached from the donor substrate. Subcritical cracks are cracks that are joined to one another only by a later main crack and, as a result of the joining, divide the donor substrate, especially into a solid-state layer and the remaining solid-state body. Subcritical cracks may alternatively also be referred to here as microcracks.

This embodiment is advantageous in that the linear design is inclined relative to a (straight) cutting line that arises at the interface between the generation plane and the crystal lattice plane and limits crack growth perpendicular to writing direction. The modifications for each writing line are thus not generated in the same crystal lattice planes. For example, the first 1-5% of the modifications for each writing line can thus intersect with just a fraction, especially less than 75% or less than 50% or less than 25% or less than 10% or no crystal lattice planes, of the last 1-5% of the modifications of the same writing line. The writing line here preferably has a length of more than 1 cm or more than 10 cm or more than 20 cm or up to 20 cm or up to 30 cm or up to 40 cm or up to 50 cm. Thus, for each writing line, significantly fewer modifications will be produced in the same crystal lattice planes, thereby limiting crack propagation along these crystal lattice planes.

This leads to a significant second advantage of the present invention, namely that the writing direction does not necessarily have to be performed in such a way that the further cracks generated must overlap the cracks generated last. It is now also possible for the writing direction to be in the opposite direction. This is because, owing to the possible shortness of the cracks via the method of the invention, there is no shading by the cracks made last. In spite of the opposite writing direction, this makes it possible to achieve, for example, line spacings of less than 100 μm, especially less than 75 μm or less than 50 μm or less than 30 μm or less than 20 μm or less than 10 μm or less than 5 μm or less than 2 μm.

A change in the material property may preferably be understood in accordance with the invention to mean the generation of a material modification or the generation of a crystal lattice defect, especially the accomplishment of a locally limited phase change.

In a further preferred embodiment of the present invention, the laser radiation may be generated with pulse lengths of less than 2 ns or less than 1 ns, especially of less than 800 ps or of less than 600 ps or of less than 500 ps or of less than 400 ps or of less than 300 ps or of less as 200 ps or of less than 150 ps or of less than 100 ps or of less than 50 ps or of less than 10 ps.

In a further preferred embodiment of the present invention, the subcritical cracks are generated with a crack length of between 10 μm and 100 μm, especially between 20 μm and 70 μm and preferably between 30 μm and 50 μm and more preferably between 35 μm and 45 μm, especially 40 μm.

In a further preferred embodiment of the present invention, the donor substrate thus includes or consists of a chemical compound, such as silicon carbide, where the chemical compound is preferably one or more substances selected from the third, fourth and/or fifth main group of the Periodic Table of the Elements and/or the 12th transition group of the Periodic Table of the Elements, wherein the material change is a predetermined physical transformation of the starting material, especially silicon carbide, in the donor substrate to a target material, especially silicon and carbon.

In a further preferred embodiment of the present invention, the physical transformation is a breakdown of the chemical compound to multiple or all individual constituents or elements. This embodiment is advantageous since the controlled breakdown of the chemical compound of the solid-state body can establish the material combination having the best suitability for a removal of the solid-state component.

According to the present description, a solid-state starting material is preferably understood to mean a monocrystalline, polycrystalline or amorphous material. Owing to the highly anisotropic atomic bonding forces, preference is given to monocrystalline materials having a highly anisotropic structure. The solid-state starting material preferably includes a material or material combination of one of main groups 3, 4, 5 and/or of transition group 12 of the Periodic Table of the Elements, especially a combination of elements from main groups 3, 4, 5 and transition group 12, for example zinc oxide or cadmium telluride.

As well as silicon carbite, the semiconductor starting material may also include, for example, silicon, gallium arsenide GaAs, gallium nitride GaN, silicon carbide SiC, indium phosphide InP, zinc oxide ZnO, aluminum nitride AlN, germanium, gallium(III) oxide Ga2O3, aluminum oxide Al2O3(sapphire), gallium phosphide GaP, indium arsenide InAs, indium nitride InN, aluminum arsenide AlAs or diamond.

The solid-state body or workpiece (e.g. wafer) or the donor substrate preferably includes a material or material combination of one of main groups 3, 4 and 5 of the Periodic Table of the elements, for example SiC, Si, SiGe, Ge, GaAs, InP, GaN, Al2O3(sapphire), AlN. More preferably, the solid-state body includes a combination of the elements that occur in the fourth, third and fifth groups of the Periodic Table. Conceivable materials or material combinations here are, for example, gallium arsenide, silicon, silicon carbide, etc. In addition, the solid-state body may include a ceramic (e.g. Al2O3—aluminum oxide) or consist of a ceramic; preferred ceramics here are, for example, perovskite ceramics (for example Pb-, O-, Ti/Zr-containing ceramics) in general and lead magnesium niobates, barium titanate, lithium titanate, yttrium aluminum garnet, especially yttrium aluminum garnet crystals for solid-state laser applications, surface acoustic wave (SAW) ceramics such as lithium niobate, gallium orthophosphate, quartz, calcium titanate, etc. in particular. The solid-state body thus preferably includes a semiconductor material or a ceramic material, and the solid-state body more preferably consists of at least one semiconductor material or a ceramic material. The solid-state body is preferably an ingot or wafer. The solid-state body is more preferably a material at least partly transparent to laser beams. It is thus also conceivable that the solid-state body includes a transparent material or consists of or has been manufactured partly from a transparent material, for example sapphire. Further materials that are useful here as solid-state material on their own or in combination with another material are, for example, "wide band gap" materials, InAlSb, high-temperature superconductors, especially rare earth cuprates (e.g. YBa2Cu3O7). It is additionally or alternatively conceivable that the solid-state body is a photomask, where the photomask material used in the present case may preferably be any photomask material known up to the filing date and more preferably combinations thereof. In addition, the solid-state body may additionally or alternatively include or consist of silicon carbide (SiC). The solid-state body is preferably an ingot which, in a starting state, i.e. in a state prior to the removal of the first solid-state component, weighs preferably more than 5 kg or more than 10 kg or more than 15 kg or more than 20 kg or more than 25 kg or more than 30 kg or more than 35 kg or more than 50 kg. The solid-state component is preferably a solid-state slice, especially a wafer of diameter at least 300 mm.

The object stated at the outset is likewise achieved according to the invention by a method of separating at least one solid-state slice, especially a solid-state wafer, from a donor substrate. The method of the invention here preferably comprises at least the steps of: providing a donor substrate, generating or disposing a stress generation layer on a surface of the donor substrate, especially a flat surface, that axially bounds the donor substrate, disposing a pressurizing element of a pressurizing device at a predetermined distance from the stress generation layer or at a predetermined distance from the detachment region for contacting with the stress generation layer during the separating, separating the solid-state slice from the donor substrate by subjecting the stress generation layer to thermal stress, which generates mechanical stresses in the donor substrate, and the mechanical stresses result in deflection of proportions of the solid-state slice, which gives rise to a crack for separation of a solid-state slice, wherein at least a separated proportion of the solid-state slice, owing to the stress generation layer, is deflected in the direction of the pressurizing element and pressed against the pressurizing element, wherein the pressurizing element limits the maximum deflection of the solid-state slice.

Preferably, the contact side of the pressurizing element is disposed at a distance in axial direction from the surface of the stress generation layer which is lower than the shortest distance between the axial center of the donor substrate and the (radial) circumferential face of the donor substrate. Preferably, the distance is between 0.001 times and 0.9 times, especially between 0.001 times and 0.5 times or between 0.001 times and 0.1 times, the length of the shortest distance between the axial center of the donor substrate and the (radial) circumferential face of the donor substrate. More preferably, the distance between the contact side of the pressurizing element and the surface of the stress generation layer is less than 5 cm, especially less than 2 cm or less than 1 cm or less than 0.5 cm or less than 0.1 cm.

Figure 3B:
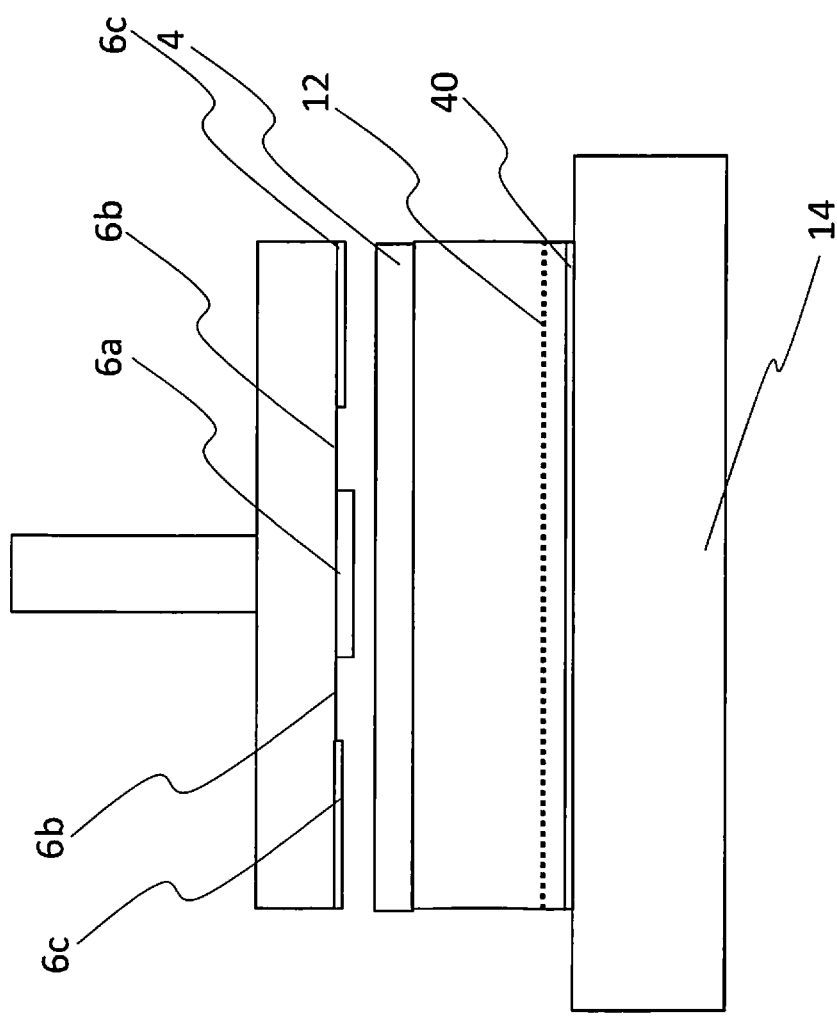

In the removal of at least partly processed wafers (precursors of electronic devices), it may be advantageous that bending of the surface is avoided— . . . this is achieved by the arrangement in FIG. 3b. It is particularly advantageous that the processed surface or processed layer of the donor substrate, especially a device layer, is bent only to a minor degree, if at all, the polymer or receiving layer is disposed on another donor substrate surface and the polymer or the receiving layer is not disposed on the processed layer. Thus, the receiving layer or polymer layer is heated, at least in the multitude of solid-state layers or wafers removed from a donor substrate, at a minimum distance from the processed layer, where the minimum distance is preferably a multiple of, especially at least twice or at least 5 times or at least 10 times or at least 20 times, the thickness of the receiving layer or polymer layer. This is advantageous since the thermal stress on the processed layer is significantly reduced.

It may further be advantageous to bond the resultant thin component wafer or processed layer directly to a transfer wafer for further processing (this transfer wafer may in turn be held, for example, by a holding device for further stabilization). The bonding is effected here by means of direct bonding or temporarily with a bonding tape, where the bond can be released, for example, by means of radiation, especially UV radiation, or heat, especially temperatures above 20° C. or above 50° C. or above 100° C., especially up to 110° C. or up to 200° C. or up to 500° C., or an alternative treatment.

This solution is preferably combinable with individual or all of the embodiments described above.

The object stated at the outset is likewise achieved by a plant for separating solid-state wafers from a donor substrate. This plant preferably comprises at least one laser device for generating modifications within the donor substrate to form a detachment region for guiding a separation crack, a temperature control device for cooling a stress generation layer placed on the donor substrate for triggering the separation crack, and a pressurizing device having at least one pressurizing element for pressurizing the stress generation layer disposed on the donor substrate during the propagation of the separation crack.

There is thus suppression of the vertical crack components. This leads to fewer departures of the crack from the plane, which results in a higher yield and/or necessitates less laser exposure. In addition, the application of force has the effect of distinctly better thermal coupling, which leads in turn to a distinctly reduced splitting time. The reduced splitting time enables better synchronization with other processes since it was more than 10 minutes per split without this application of force and is less than one minute through the application of force. Overall, it is thus possible to a distinct improvement in line control comprising two or more of the following treatment steps: generating modifications within the solid-state body or donor substrate by means of a laser and/or applying a polymer film to the donor substrate, especially by means of a laminating device, and/or splitting the donor substrate in the region or along the detachment plane generated by the modifications or the detachment region as a result of the introduction of an external force into the donor substrate, especially by means of a cooling device or an ultrasound device, and/or performing a surface treatment or surface processing operation on the surface of the remaining residual donor substrate exposed by the split, especially by means of a material-removing processing device, such as a grinder, and/or a chemical surface treatment, especially by etching.

The solution of the invention is therefore also advantageous in that the application of force reduces the bending of the solid-state body removed or to be removed to a minimum, or completely prevents it. This also enables splitting of a solid-state layer, especially composite structure, away from the donor substrate on which semifinished or finished functional components, especially devices, for example transistors, or resistors or processors are disposed or generated. In addition, a higher temperature in the middle plane (device plane) is possible, which likewise reduces the risk of damage to the devices. Thus, a significant improvement in the processes is provided for the MEMS and/or compound wafer treatment.

Pressurizing element a contact surface for contacting with the surface of the stress generation layer has. The temperature control device is preferably a cooling device, especially a device for providing at least one or exactly one functional fluid, especially liquid nitrogen or nebulized nitrogen. At least one pressurizing element has been provided with a heating element.

The subject matter of patent application DE 10 2017 003 830.9, filed by the applicant at the German Patent and Trademark Office, are hereby incorporated fully into the subject matter of the present patent application by reference.

The use of the words "essentially" preferably defines, in all cases in which these words are used in the context of the present invention, a deviation in the range of 1%-30%, especially of 1%-20%, especially of 1%-10%, especially of 1%-5%, especially of 1%-2%, from the stipulation that would be given without the use of these words. Individual or all representations of the figures described hereinafter should preferably be regarded as construction drawings, i.e. which correspond from the dimensions, proportions, functional relationships and/or arrangements that result from the figure(s) preferably exactly or preferably essentially to those of the apparatus of the invention or product of the invention. Further advantages, aims and properties of the present invention of elucidated by the description of appended drawings that follows, in which apparatuses of the invention are detailed by way of example. Elements of the apparatuses and processes of the invention that at least essentially correspond in terms of their function in the figures may be identified here by identical reference numerals, with no need for numbering or elucidation of these components or elements in all figures. The invention is described purely by way of illustration hereinafter with reference to the appended figures.

These show by way of example:

FIG. 1a a schematic of an apparatus for pressurization of a donor substrate provided with a stress generation layer by means of a pressurizing device, FIG. 1b a schematic of an arrangement according to FIG. 1b, wherein the donor substrate has been modified in its interior by means of laser beams, FIG. 2 a schematic of an apparatus for limiting a deflection movement of the solid-state layer components removed, FIG. 3a/b/c a schematic of a pressurizing device with multiple pressurizing elements, FIG. 4a a schematic of an apparatus for pressurizing different surface components of the stress generation layer with different pressures, FIG. 4b a schematic of an apparatus for pressurizing different surface components of the stress generation layer with different pressures and for limiting the deflection movement of the solid-state wafer, and FIG. 4c a schematic of a top view of the apparatus shown in FIG. 4b.

FIG. 1a shows an apparatus for separating solid-state slices 1 (cf. FIG. 2) from a donor substrate 2. This apparatus preferably has a holding device 14 for fixing the donor substrate 2. There is a stress generation layer 4, especially consisting of or including a polymer material, disposed on the donor substrate 2. The surface of the stress generation layer 4 remote from the donor substrate 2, in the variant shown, comes into contact with a contact side of a pressurizing element 6 of a pressurizing device 8. The pressurizing device 8 here may, for example, include or be coupled to an electric or hydraulic or pneumatic or mechanical force generation device, especially an actuator, for generating a force for pressing the pressurizing element 6 against the stress generation layer 4. The pressurization is preferably adjustable by means of the force generation device. A temperature control device 26 preferably imparts thermal stress, especially cooling, to the stress generation layer 4. The thermal stress on the stress generation layer 4 here may be indirect or exclusively indirect, meaning that, for example, the temperature of the pressurizing element 6 is first adjusted, and this then adjusts the temperature of the stress generation layer 4. It is also conceivable that there is direct and indirect control of the temperature of the stress generation layer 4 with time. The temperature control device 26 is preferably a functional fluid 28, especially nitrogen in preferably liquid or nebulized form. In addition, the pressurizing element 6 can be pressed onto predetermined proportions of the stress generation layer 4 and, at the same time, the temperature of different predetermined proportions of the same stress generation layer 4 can be adjusted by the temperature control device 26.

The thermal stress results in contraction of the stress generation layer 4, which generates mechanical stresses in the donor substrate 2. The pressurizing device 8, simultaneously with the generation of stress, brings about pressurization of components of the stress generation layer 4 or of the complete stress generation layer 4 disposed between the pressurizing element 6 and the substrate 2.

The pressurizing device 8 thus counteracts force peaks that occur on attainment of the glass transition of the stress generation layer 4. In addition, the pressurizing device 8 preferably likewise reduces deflection of the components of the solid-state layer 1 that have been split off, which means that the wedge action that arises in the course of crack propagation occurs with a significantly smaller angle, which means that the crack runs in a much more stable manner in the predefined detachment plane 12 (cf. FIG. 1b).

Reference sign D indicates the preferred direction of pressure application.

The illustration shown in FIG. 1b corresponds essentially to the illustration shown in FIG. 1a, wherein the donor substrate 2 has modifications 10 that have been generated by means of laser beams. The modifications 10 define a detachment region 12 for progression of a crack for separation of the solid-state slice 1 from the donor substrate 2.

FIG. 2 shows that the pressurizing element 6 may have one or more passage element(s) 18 or conductive element(s) 18 for conducting the functional fluid. In addition, this illustration shows a situation in which the pressurizing element 6 is used to limit the deflection movement of the solid-state layer components removed. The contact side 16 of the pressurizing element 6 is preferably spaced apart at a distance AS from the exposed surface of the stress generation layer 4 or from the detachment plane 12. The distance AS is preferably a fraction or less than a defined fraction of the shortest distance between the radial circumferential surface O and the axial center L. In addition, this embodiment, purely by way of example, has a guide device 30 for defining a direction of movement of the pressurizing device 8 in the event of deflection. Such guide devices may be provided in all the embodiments described herein.

FIG. 3a shows, in schematic form, that multiple pressurizing elements 6a, 6b, 6c of different configuration may be part of the pressurizing device 8. The pressurizing elements 6a, 6b, 6c shown here have different heights. When 6a is pressed onto the stress generation layer 4, there is thus greater compression of the stress generation layer 6 than when 6c is pressed on. Thus, there is a greater pressure in the region between 6a and the donor substrate 2 than between 6c and the donor substrate 2. In other words, a greater pressure is preferably built up in the center than in the edge region, and the reverse configuration is also possible. In this embodiment, the region 6b is pressed to the least degree, if at all, onto the donor substrate 4.

FIG. 3b shows, in schematic form, that pressurization is possible from the "thicker" side, where the layer is prevented from bending by a holding device 14 (e.g. vacuum vessel, or else by means of holding tape . . . ). The detachment region 12 here is preferably at a smaller distance from the processed layer in at least the majority of the removal steps effected in the division of a donor substrate 2 into a multitude of wafers than from a surface with which a pressurizing element is contacted. In this case, the processed surface 40 bounds the donor substrate 2 in longitudinal donor substrate direction on the one hand and the surface on which the pressurizing element is contacted bounds the donor substrate 2 in longitudinal donor substrate direction on the other hand. This ensures, in the case of at least partly completed devices on the wafer, that these are bent only within a limited scope, if at all. In addition, the necessity of pressurizing the surface of the device side is avoided.

FIG. 3c shows a variant in which the processed surface 40 is bonded to a transfer substrate or a wafer (technically transfer wafer) by means of a bonding layer or a bonding interface 42. The bonding layer or bonding interface 42 may be formed here, for example, by an adhesive layer, especially an adhesive tape, or by a phase-changing substance, especially a fluid, especially a liquid. If the bonding interface 42 is formed by a phase-changing substance, the phase-changing substance preferably has a freezing point at ambient pressure of lower than 20° C. or of lower than 10° C. or of lower than 5° C. or of 0° C. or of lower than −5° C. or of lower than −20° C. The phase-changing substance is preferably water, especially demineralized water (DM water). The bonding substrate 44 and/or the processed surface 40 are preferably wetted or moistened with the phase-changing substance, wherein the phase-changing substance is in a first state of matter. Subsequently, the processed surface 40 is placed onto or applied to, especially pressed onto, the bonding substrate 44. In addition, the temperature of the phase-changing substance is preferably adjusted to below the freezing point of the phase-changing substance, which results in conversion of the phase-changing substance from the first state of matter, especially liquid, to a second state of matter, especially solid. The cooling can be brought about here by the cooling which is effected to adjust the temperature of the receiving layer. Additionally or alternatively, it is possible that the phase-changing substance is adjusted to a temperature below its freezing point prior to the adjustment of temperature of the receiving layer. This is advantageous since this bonding interface can be reversibly produced and eliminated. In addition, more preferably, no toxic substances are required here.

FIG. 4a shows a working example in which the pressurizing device 8 includes multiple pressurizing elements 6a, 6b and 6c that are movable relative to one another. These pressurizing elements 6a, 6b, 6c may each be coupled via force transmitters 20, 22, 24 to one or more actuators for providing equal or different pressing forces. According to the invention, the individual pressurizing elements 6a, 6b, 6c may be deflected independently of one another, especially when the force acting on the respective pressurizing element 6a, 6b, 6c exceeds a threshold force or minimum force defined for the respective pressurizing element 6a, 6b, 6c.

FIG. 4b shows an embodiment in which the pressurizing element 6b is moved further into the stress generation layer 4 than the other pressurizing elements 6a and 6c.

FIG. 4c shows, purely by way of example, that the pressurizing device 8 can have a round contact side 16. The pressurizing elements 6a, 6b, 6c are formed here correspondingly. Alternatively, however, it is likewise possible in the context of the present invention that the contact side 16 may have a shape different from a round shape, especially a shape with one or more straight edges, especially a rectangular shape.

LIST OF REFERENCE SIGNS 1 solid-state slice
2 donor substrate
4 stress generation layer
5 surface
6 pressurizing element
8 pressurizing device
10 modification
12 detachment region
14 holding device
15 heating element
16 contact side of the pressurizing element/contact surface for limiting deflection
18 passage element
20 first force application element
22 second force application element
24 third force application element
26 temperature control device
28 functional fluid
30 guide
40 processed surface
42 bonding interface
44 bonding substrate
A shortest distance between center L and circumferential surface
D pressure application direction
L longitudinal direction/axial center
AS distance between pressurizing element and detachment plane

The invention claimed is:

1. A method of separating a solid-state slice from a donor substrate, the method comprising:
generating or disposing a stress generation layer on a surface of the donor substrate and that axially bounds the donor substrate;
pressing the stress generation layer onto the surface;
separating the solid-state slice from the donor substrate by subjecting the stress generation layer to thermal stress which generates mechanical stresses in the donor substrate and gives rise to a crack for separation of the solid-state slice,
wherein the pressing of the stress generation layer onto the surface occurs during the subjecting of the stress generation layer to the thermal stress,
wherein subjecting the stress generation layer to the thermal stress comprises cooling the stress generation layer such that at least a part of the stress generation layer undergoes a glass transition which generates forces that transfer to the donor substrate and give rise to the crack.

2. The method of claim 1, wherein the pressing of the stress generation layer onto the surface comprises applying a compression force in a range between 10 N and 100 kN to the stress generation layer.

3. The method of claim 1, wherein the stress generation layer is contacted in two dimensions during the pressing.

4. The method of claim 1, wherein the pressing of the stress generation layer onto the surface comprises applying pressure in an edge region of the donor substrate on which the stress generation layer is disposed.

5. The method of claim 1, wherein the pressing of the stress generation layer onto the surface comprises applying pressure in a center region of the donor substrate on which the stress generation layer is disposed.

6. The method of claim 1, wherein the pressing of the stress generation layer onto the surface comprises applying pressure over an entire flat proportion of the surface of the donor substrate on which the stress generation layer is disposed.

7. The method of claim 1, further comprising:
allowing the solid-state slice to deflect relative to the donor substrate during the thermal stress.

8. The method of claim 1, further comprising:
allowing the donor substrate to deflect relative to the solid-state slice during the thermal stress.

9. The method of claim 7, further comprising:
limiting a maximum deflection of the solid-state slice during the thermal stress.

10. The method of claim 1, wherein the pressing of the stress generation layer onto the surface comprises applying locally different pressures to the stress generation layer.

11. The method of claim 1, wherein the pressing of the stress generation layer onto the surface comprises varying an application of pressure to the stress generation layer based on one or more of: a distance from an axial center of the donor substrate; a propagation rate of the crack; the thermal stress; a material of the donor substrate; and conditioning of the donor substrate.

12. The method of claim 1, further comprising:
conditioning the donor substrate,
wherein laser-generated modifications define a detachment region along which the solid-state slice is separated from the donor substrate.

13. The method of claim 12, wherein the stress generation layer includes a polymer material, wherein the polymer material has a glass transition temperature below 20° C., wherein the polymer material is cooled down to a temperature below the glass transition temperature, wherein the glass transition that occurs generates the mechanical stresses in the donor substrate.

14. The method of claim 1, wherein the donor substrate comprises silicon carbide, and wherein a material alteration occurs within the donor substrate by a predetermined transformation of the silicon carbide to silicon and carbon.

15. The method of claim 1, wherein the cooling of the stress generation layer comprises cooling the stress generation layer using liquid nitrogen.

16. The method of claim 1, wherein the pressing of the stress generation layer onto the surface comprises:
generating a force by an electrical, hydraulic, pneumatic or mechanical actuator; and
applying the force to at least a part of the stress generation layer.

17. The method of claim 1, further comprising:
after separation of the solid-state slice, heating the stress generation layer.

18. The method of claim 17, wherein the heating of the stress generation layer comprises heating the stress generation layer above a glass transition temperature of the stress generation layer.

* * * * *